United States Patent [19]

Hertel et al.

[11] 4,449,885

[45] May 22, 1984

[54] WAFER TRANSFER SYSTEM

[75] Inventors: Richard J. Hertel, Bradford; Edward D. MacIntosh, Gloucester, both of Mass.

[73] Assignee: Varian Associates, Inc., Palo Alto, Calif.

[21] Appl. No.: 381,085

[22] Filed: May 24, 1982

[51] Int. Cl.³ .............................................. B65G 1/00
[52] U.S. Cl. .................................... 414/750; 414/417; 198/345
[58] Field of Search ............... 414/417, 449, 450, 290; 118/500, 729; 198/345

[56] References Cited

U.S. PATENT DOCUMENTS

| | | | |
|---|---|---|---|
| 3,730,595 | 5/1973 | Yakubowski | 414/749 X |
| 4,030,622 | 6/1977 | Brooks et al. | 414/290 |
| 4,108,323 | 8/1978 | Shambelan et al. | 414/417 |
| 4,311,427 | 1/1982 | Coad et al. | 414/217 |
| 4,367,915 | 1/1983 | Georges | 414/417 X |

*Primary Examiner*—Joseph E. Valenza
*Assistant Examiner*—David A. Bucci
*Attorney, Agent, or Firm*—Stanley Z. Cole; William R. McClellan

[57] ABSTRACT

A system for the automated transfer of semiconductor wafers between a cassette and a wafer processing chamber. Included in the system are a cassette conveyor assembly, a wafer transfer assembly and a wafer handling assembly associated with the entrance to the processing chamber. Wafers of any standard size can be accommodated by the system. The cassette conveyor assembly includes a cassette holder which retains and precisely positions two standard plastic cassettes. The cassette holder is positioned by a ball reverser driven by a motor and a mechanical stepper. The wafer transfer assembly includes an elevator blade which vertically raises and lowers wafers to and from the wafer handling assembly. The elevator blade is actuated by a crank driven by a motor and a mechanical stepper. The crank provides a high rate of wafer transfer and a low risk of wafer damage.

11 Claims, 14 Drawing Figures

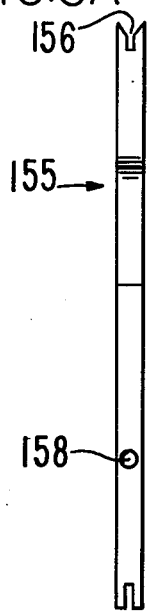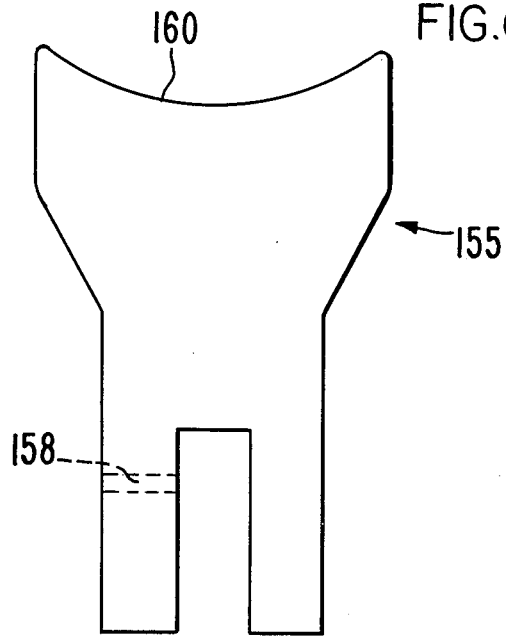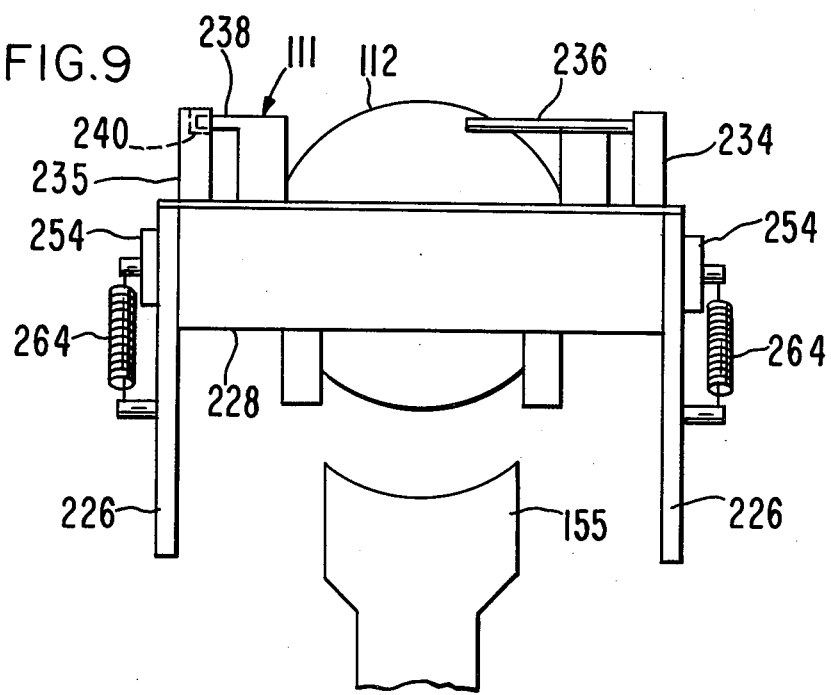

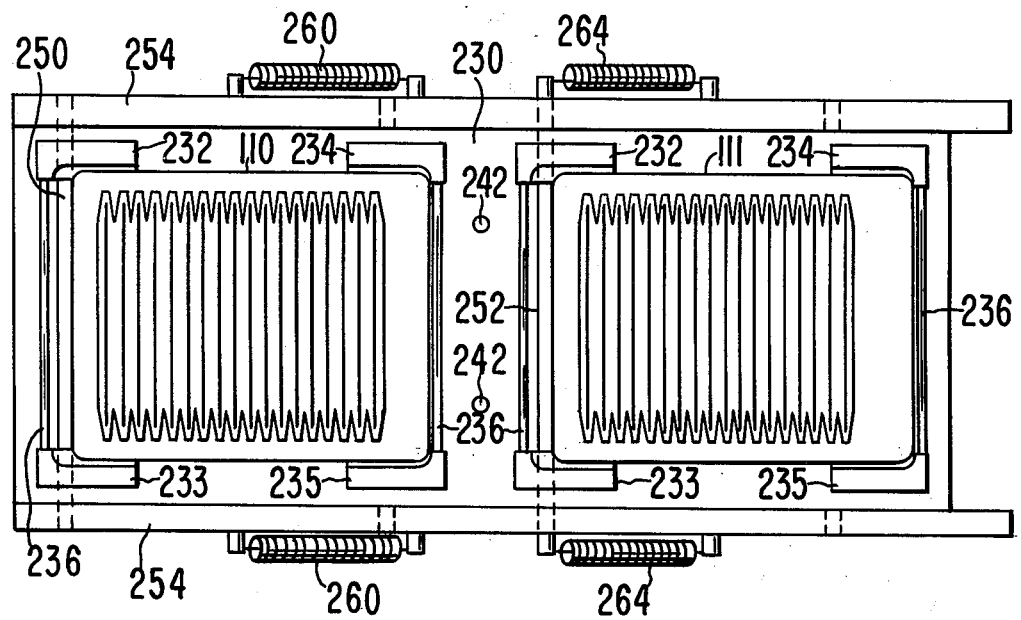
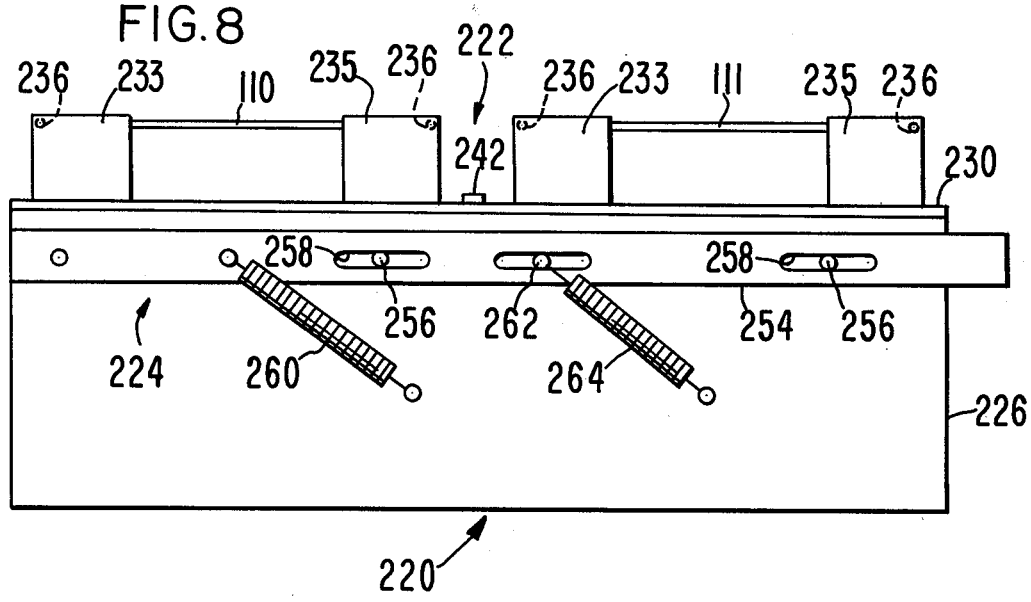

WAFER TRANSFER SYSTEM

BACKGROUND OF THE INVENTION

This invention relates to processing of semiconductor wafers and, more particularly, relates to apparatus for automated transfer of semiconductor wafers between a cassette type wafer holder and a wafer processing chamber.

Ion implantation has become a standard technique for introducing impurities into semiconductor wafers in a controlled and rapid manner. A beam of ions is generated in a source and directed with varying degrees of acceleration toward the semiconductor wafer. Impurities are introduced into the bulk of semiconductor wafers by using the momentum of the ions as a means of imbedding them in the crystalline lattice of the semiconductor material.

One of the major objectives in commercial semiconductor processing is to achieve a high throughput in terms of wafers processed per unit time. Rapid movement of wafers into and out of the processing chamber is one important factor in attaining high throughput. However, such, wafers are highly fragile and easily damaged due to their thinness (of the order of 10 to 20 mils), large diameter (2 to 5 inches) and highly polished faces which can be rendered useless for device fabrication by many kinds of contamination, abrasion or damage. Thus, extraordinary handling precautions are required and manual wafer handling is undesirable.

Batch processing of a large number of wafers is one way to improve throughput. However, such systems are usually large and expensive to accommodate the batches and involve manual loading of wafers. Furthermore, in the event of a malfunction in a batch processing system, a large number of very expensive semiconductor wafers can be damaged or destroyed.

In serial ion implantation systems, one wafer at a time is processed, and the ion beam is electrostatically scanned over the surface of the wafer until the desired impurity dosage is reached. Such systems are usually smaller and less expensive. However, the wafer transfer time is critical to throughput, since it occurs each time a wafer is processed.

To assist in achieving high throughput, automated wafer transfer systems have been developed. These systems typically transfer wafers from a wafer carrier, or cassette, into a wafer processing chamber and then back into the cassette without intervention by an operator. In one type of automated system, the cassette is mounted vertically with the wafers in a horizontal orientation. The wafers are transferred to and from the processing chamber by various combinations of vacuum picks, air tracks, moving belts and gravity. While such systems provide generally satisfactory operation, there is a tendency for particles to drop on the horizontally oriented wafers and cause contamination.

An automated wafer transfer system, in which the wafers are maintained in a vertical orientation in the cassette and during transfer to and from the processing chamber, is disclosed in U.S. Pat. No. 4,311,427, issued Jan. 19, 1982, to Coad et al. In the disclosed system, an elevator blade edgewise lifts a wafer out of a cassette from below and raises it to a vacuum chuck positioned in the door of a processing chamber. The cassette is positioned over the blade by a chain drive actuated by a stepper motor. The vertical wafer handling system reduces particulate contamination and, due to the edgewise handling of the wafers, reduces abrasion and damage thereof. While such prior art systems provide numerous advantages and generally satisfactory operation, they have certain disadvantages. The elevator blade is actuated by an air cylinder which provides a constant vertical velocity. To avoid breakage of the wafer upon contact, and to avoid exceeding the acceleration of gravity during lowering of the wafer, the speed of the vertical blade must be limited. Therefore, the wafer transfer rate is limited. An additional disadvantage relates to the fact that specially made cassettes are required for compatibility with the cassette conveyor mechanism.

It is a general object of the present invention to provide new and improved apparatus for the vertical transfer of wafers between a cassette and a processing station.

It is another object of the present invention to provide apparatus for precisely positioning a commonly used plastic cassette in an automated wafer transfer system.

It is yet another object of the present invention to provide apparatus for rapidly raising and lowering a wafer from a cassette to a processing station.

It is still another object of the present invention to provide an automated wafer transfer system capable of handling a variety of wafer sizes.

It is still a further object of the present invention to provide an automated wafer transfer system having simple, inexpensive drive systems for positioning a cassette and for lifting wafers.

SUMMARY OF THE INVENTION

According to the present invention, these and other objects and advantages are achieved in an automated wafer transfer system including apparatus for accurately positioning a cassette, of the type having outwardly extending ribs along opposite sides thereof, for access to individual wafers from below by a vertical wafer lift mechanism. The apparatus comprises a cassette holder and means for positioning the cassette holder relative to the vertical wafer lift mechanism. The cassette holder includes a housing having a generally open top and bottom for access by the lift mechanism, cassette adaptor means, and cassette retention means. The cassette adaptor means includes an adaptor plate mountable to the top of the housing and having an aperture corresponding in size to the cassette and cassette support means positioned for support of the cassette in the aperture by the outwardly extending ribs. The cassette retention means includes a spring-loaded retention bar operative to bear against an end of the cassette and to retain it in a predetermined position in the cassette holder.

According to another aspect of the present invention, there is provided, in an automated system for the transfer of wafers between a cassette and a processing station, apparatus for edgewise engaging a wafer from below and for rapidly raising and lowering the wafer from the cassette to the processing station. The apparatus comprises elevator means including a vertically movable elevator blade having an arcuate leading edge provided with a groove adapted to engage edgewise the wafer and means for guiding the elevator blade along a linear path. The apparatus further comprises drive means operative to provide at an output thereof, rotary stepping motion about a drive axis, and crank means coupled between the output of the drive means and the elevator means. The crank means is operative to convert the rotary stepping motion of the drive means to reciprocating linear motion having relatively low velocity near its end points, thereby reducing the risk of damage when the wafer is contacted and having relatively high velocity near its midpoint, thereby increasing the rate of wafer transfer.

BRIEF DESCRIPTION OF THE DRAWINGS

For a better understanding of the present invention, together with other and further objects, advantages and capabilities thereof, reference may be had to the accompanying drawings which are incorporated herein by reference and in which:

FIGS. 6a and 6b illustrate an elevator blade used in the wafer transfer system of FIGS. 2-4;

FIG. 7 is a top view of the cassette holder used in the wafer transfer system of FIGS. 2-4;

FIG. 8 is a side elevation view of the cassette holder of FIG. 7; and

FIG. 9 is an end view of the cassette holder of FIG. 7 illustrating the elevator blade in its lowered position.

DETAILED DESCRIPTION OF THE INVENTION

Figure 1:
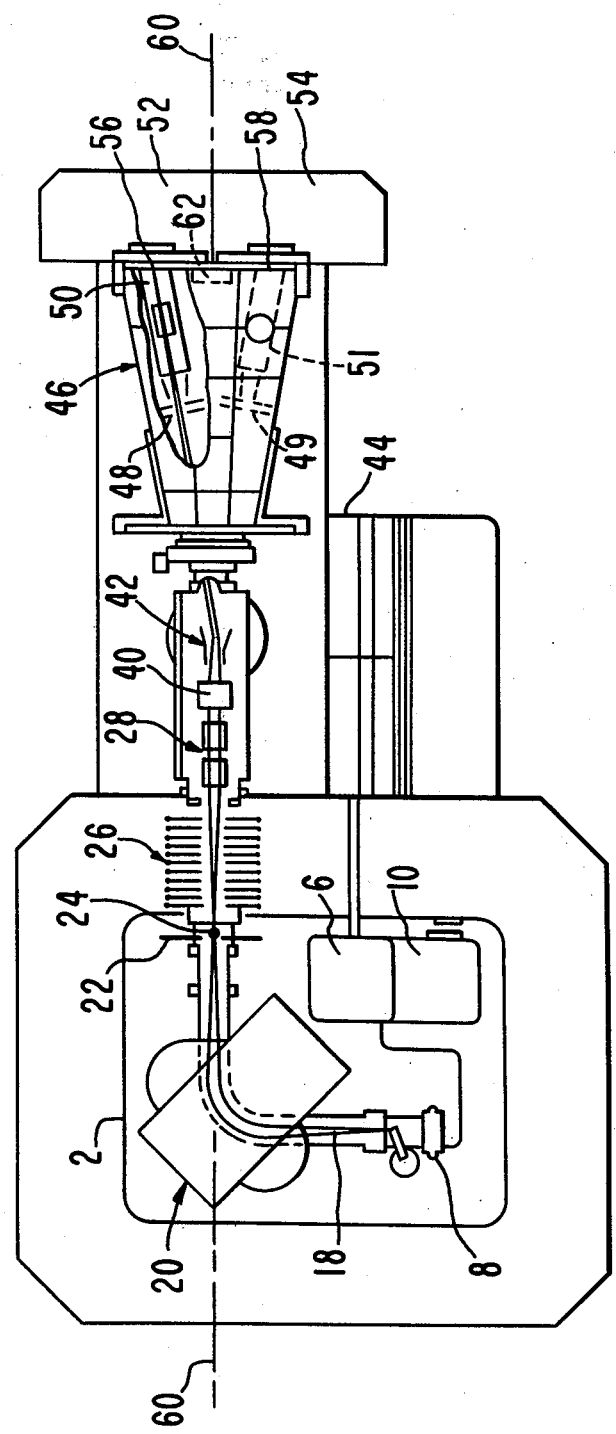
FIG. 1 is a schematic diagram, viewed from above, of an ion implantation system.

The automated wafer transfer system according to the present invention is typically used in an ion implantation system. An example of an ion implantation system is illustrated in FIG. 1. A high voltage terminal 2 is held at high potential relative to ground by a high voltage power supply (not shown). The terminal 2 houses the apparatus required to form a beam of ions of desired species. In common practice, a gaseous feed stock of the desired species is employed. A source gas produced from a gas handling system 6 is directed to an ion source 8 which is powered by a power supply 10 and provides a high current ion beam 18. Ion source techniques are generally known in the art. The ion beam 18 diverging from the ion source 8 is mass analyzed and focused by an analyzer magnet 20. The analyzed beam passes through a resolving aperture 22 and a variable slit 24 and then through an acceleration tube 26 where it encounters a carefully designed field gradient from the high voltage terminal 2 to ground potential. Optical elements such as a quadrupole lens 28 operate to produce a spatial energy focus at a target plane. Y deflection plates 40 and X deflection plates 42 provide electrostatic deflection which directs the beam 18 over the area of the target plane. The waveforms applied to the respective deflection plates to form the desired scanning pattern are provided by a scanning system 44.

A dual target chamber 46 includes a housing, beam defining masks 48, 49 and Faraday cages 50, 51 for beam monitoring. Automatic wafer transfer systems 52, 54 introduce semiconductor wafers one at a time into the vacuum system in target positions 56, 58, respectively, align the same with respect to the target plane, provide cooling of the wafers during implantation and remove the wafers from the vacuum system after implantation is complete. Target positions 56, 58 are typically located within air locks and are displaced horizontally on opposite sides of the longitudinal axis 60 of the undeflected beam 18 such as to require a beam deflection of about ±7° from the longitudinal axis for scanning thereof. A beam dump 62 is located on the longitudinal axis 60 in the target chamber 46 and intercepts the neutral portion of the ion beam 18.

Figure 2:
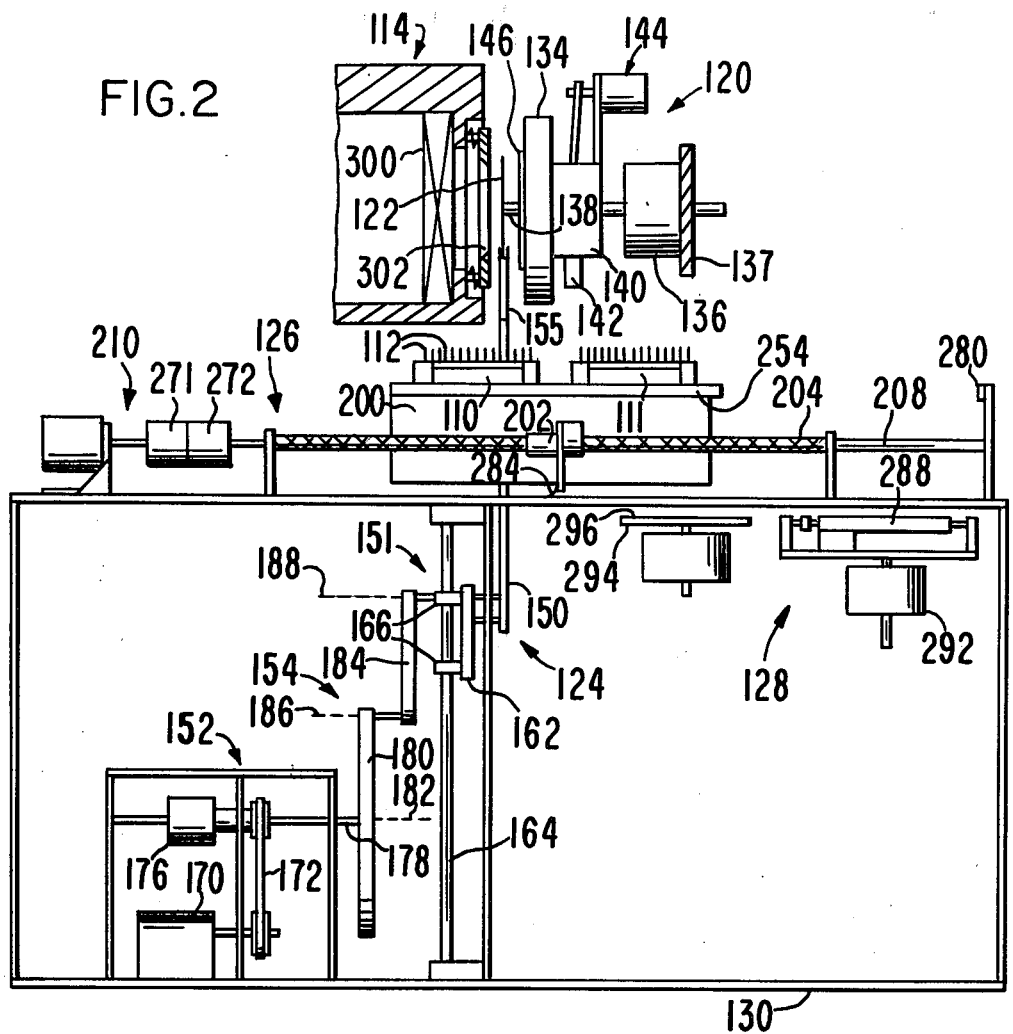
FIG. 2 is a simplified side elevation of an automated wafer transfer system with the elevator blade raised.

An automated wafer transfer system, corresponding to the systems 52, 54 in FIG. 1, is illustrated in simplified form in FIG. 2. The system automatically transfers generally circular semiconductor wafers, one at a time, between cassettes 110, 111, each holding a plurality of wafers 112, and a wafer processing chamber 114. The cassettes 110, 111 each include a plurality of parallel slots for holding the wafers 112 in an upright, parallel position and are used for transporting and temporarily storing the wafers 112. The cassettes 110, 111 are typically a plastic material and, in the system of FIG. 2, must have open bottoms to provide access to the wafers 112 from below. The wafer processing chamber 114 is a vacuum chamber and in the present example is an end station for serial ion implantation of wafers.

The wafer transfer system shown in FIG. 2 includes wafer handling means 120 associated with an entrance to the processing chamber 114 for receiving a wafer 122 and moving the wafer 122 into the processing chamber 114. The transfer system further includes transfer means 124 for transporting the wafer 122 between the cassettes 110, 111 and the wafer handling means 120 and cassette conveyor means 126 for positioning the cassettes 110, 111 relative to the transfer means 124. The system still further includes means 128 for prealigning a guide flat on each of the plurality of wafers 112 in the cassettes 110, 111. The elements of the wafer transfer system are mounted on a suitable frame 130.

Figure 3:
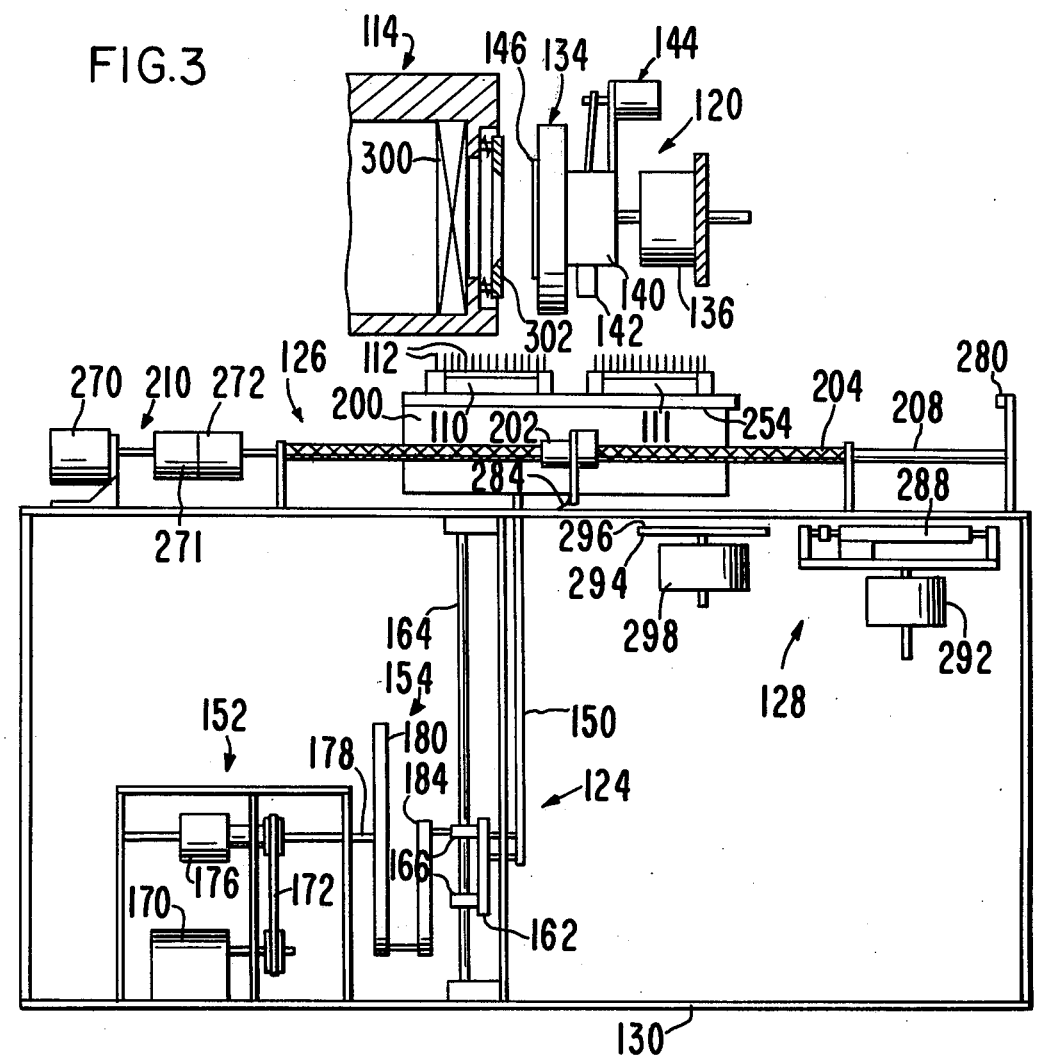
FIG. 3 is a simplified side elevation of an automated wafer transfer system with the elevator blade lowered.

The wafer handling means 120 includes a chamber door 134, means 136 for moving the chamber door 134 between an open position, as shown in FIG. 2, and a sealed position and means for engaging the wafer 122 and rotating it through a preselected angular displacement. The means 136 is attached to a rigid frame member 137. The means for engaging the wafer 122 and rotating it includes a rotatable vacuum chuck 138, means enclosed within a housing 140 for moving the vacuum chuck 138 between a wafer-receiving position, as shown in FIG. 2, and a retracted position, as shown in FIG. 3, and means for rotating the vacuum chuck 138 through a preselected angular displacement. The means for rotating the vacuum chuck 138 includes a motor 142 and programmable control means 144 each coupled to the vacuum chuck 138. The chamber door 134 typically includes a wafer-receiving surface, or platen 146, against which the wafer 122 is held during processing and means (not shown) for cooling the platen 146. For additional information relating to the wafer handling means 120, reference is made to Hertel, "Wafer Orientation System," U.S. Ser. No. 381,286, filed concurrently herewith. It will be understood that the means 128 for prealigning the guide flats and the means for rotating the vacuum chuck 138 are features of the illustrated wafer transfer system but are not required elements of a system in accordance with the present invention.

The transfer means 124 includes an elevator assembly including an elevator blade 150 and elevator blade guide means 151. The transfer means 124 further includes drive means 152 and crank means 154 coupling the drive means 152 to the elevator assembly. The elevator blade 150 is an elongated, thin member having an easily replaceable blade tip 155, as illustrated in FIGS. 6a and 6b. The blade tip 155 has an arcuate leading edge provided with a groove 156 adapted to engage edgewise a wafer in the cassettes 110, 111 from below and raise the wafer to the wafer handling means 120. The groove 156 includes sloping outer edges and, at its center, a slot with vertical sides. Thus, if the wafer is slightly off center in the cassette, it is urged toward the slot by the sloping sides of the groove 156. After the wafer drops into the vertical slot, side-to-side movement during raising and lowering is prevented. The blade tip 155 is provided with a mounting hole 158 for attachment to the main portion of the elevator blade 150 by a fastener element such as a set screw. The radius of curvature 160 of the leading edge of the blade tip 155 corresponds to the dimension of the wafers being processed. When the size of the wafers being processed is changed, a different blade tip 155 having the proper radius of curvature 160 is easily attached to the elevator blade 150. The width and thickness of the elevator blade 150 and the blade tip 155 are such as to pass through the cassettes 110, 111 without contacting adjacent wafers.

The lower end of the elevator blade 150 is rigidly attached to the guide means 151, which includes a carriage 162 coupled to a pair of vertically oriented, parallel ball shafts 164 by linear bearings 166. The ball shafts 164 are rigidly coupled at their tops and bottoms to the frame 130 and confine the carriage 162 and the elevator blade 150 to linear vertical movement.

The drive means 152 includes a motor 170 coupled through a timing belt 172 to a mechanical stepper 176. The output of the mechanical stepper 176 is the drive means output 178. Upon actuation of the mechanical stepper 176, the output 178 rotates by one-half turn and raises or lowers the elevator blade 150. The mechanical stepper 176 can be driven by a low cost fractional horsepower motor.

Figure 5A:
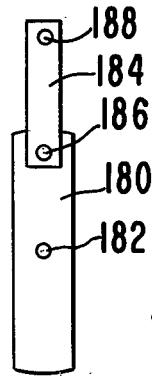
FIGS. 5a-5e illustrate the operation of the crank used in the wafer transfer system of FIGS. 2-4.
Figure 5B:
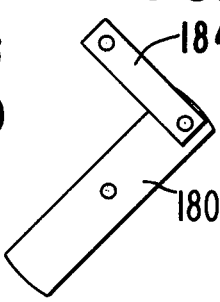
Figure 5C:
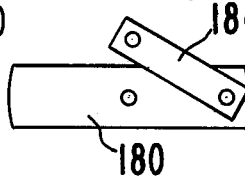
Figure 5D:
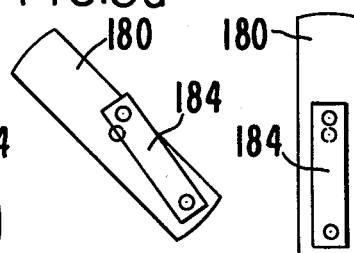
Figure 5E:
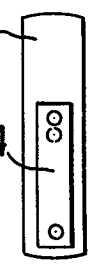

The crank means 154 includes a first crank arm 180 coupled to the output 178 of the drive means 154 so as to rotate about a drive axis 182. A second crank arm 184 has one end coupled to the first crank arm 180, so as to pivot about an intermediate axis 186 parallel to the drive axis 182 and spaced therefrom. The other end of the second crank arm 184 is coupled to the carriage 162, so as to pivot about a final axis 188 parallel to the intermediate axis 186. The intermediate axis 186 is spaced from the final axis 188 by a distance greater than the distance between the intermediate axis 186 and the drive axis 182 to insure proper operation of the crank means 154. The operation of the crank means 154 is described with reference to FIGS. 2, 3 and 5. FIGS. 5a–5e illustrate the operation of the crank means 154 in 45 degree increments of the first crank arm 180, as the crank means 154 moves from the raised position to the lowered position of the elevator blade 150. FIG. 5a illustrates the configuration of the crank means 154 with the elevator blade 150 raised, as shown in FIG. 2, while FIG. 5e illustrates the configuration of the crank means 154 with the elevator blade 150 lowered, as illustrated in FIG. 3.

The disclosed crank configuration is particularly advantageous in the transfer of wafers. As the elevator blade 150 is raised, it has a low initial velocity, rapidly accelerates to a high velocity during the middle portion of its travel, and then rapidly decelerates to a low velocity as it reaches the vicinity of the chamber door 134. The low initial velocity reduces the possibility of damage to the wafer as the blade tip 155 comes into contact with the wafer. The relatively high velocity during the middle portion of the travel increases the rate of wafer transfer. During lowering, the acceleration of the elevator blade 150 must be kept below the acceleration of gravity. If the elevator blade 150 exceeds the acceleration of gravity during lowering thereof, the wafer 122 is left in mid-air.

In one example of a transfer means 124 in accordance with the present invention, the effective length of the first crank arm 180 was 5.25 inches and the effective length of the second crank arm 184 was 6.25 inches. The mechanical stepper 176 was a type L1005B-25239 manufactured by Motion Control and the motor 170 was a type NCI-13D3 1/30 horsepower gearmotor manufactured by Bodine Electric Co. This arrangement produced a vertical stroke of the elevator blade 150 of 10.5 inches in ¾ of a second, with the acceleration remaining less than that of gravity.

The cassette conveyor means 126 includes a cassette holder 200 coupled on one side through a ball reverser nut 202 to a ball reverser shaft 204 and, on the opposite side, through linear bearings 206 to a ball shaft 208. The ball reverser screw 204 is actuated by drive means 210 which provide stepwise movement of the cassette holder 200. The ball reverser shaft 204 and the ball shaft 208 are supported above the frame 130 by mounting blocks 212 and 214, respectively.

The cassette holder 200 is illustrated in FIGS. 7–9 and includes a housing 220, a cassette adaptor 222 and cassette retention means 224. The housing 220 includes two parallel side members 226 coupled together at their ends by two narrow end members 228. The housing 220 is open at its top and bottom for raising and lowering of wafers by the elevator blade 150. The lower portion of the ends of the housing 220 are also open to permit passage of the holder 200 over the lowered elevator blade 150.

In the example of FIGS. 7–9, the cassette holder 200 is designed to accept two cassettes. It will be understood that the holder can be scaled to accept any number of cassettes. The cassette adaptor 222 includes an adaptor plate 230 mounted to the top of the housing 220 and having apertures therethrough somewhat larger in dimension than the outside dimensions of the cassettes. Mounted to the top of the adaptor plate 230 around the apertures therein are two sets of support blocks 232, 233, 234, 235 which provide support for the cassettes 110, 111. Opposite sets of support blocks 232 and 233; 234 and 235 are stabilized by crossbars 236. The cassettes 110, 111 can be standard plastic cassettes of the type having outwardly extending ribs 238 (as best seen in FIG. 9) along opposite upper sides thereof. Such cassettes are specified by the standards of the Semiconductor Equipment Manufacturers Industry (SEMI) and are widely used in the semiconductor industry. The support blocks 232, 233, 234, 235 are provided with notches 240 for receiving the ribs 238 and laterally positioning the cassettes 110, 111 in the holder 200. Furthermore, one of the support blocks 232, 233, 234, 235 is provided with an additional notch (not shown) which mates with a keying projection on the cassette and prevents the cassettes from being incorrectly inserted into the holder 200. The cassette adaptor 222 is attached to the housing 220 by quick release fasteners 242. Upon release of the fasteners 242, the cassette adaptor 222 can be easily removed from the housing 220 and replaced with a cassette adaptor for different size cassettes. Thus, the cassette holder 200 can easily accept cassettes of any size.

The cassette retention means 224 includes retention bars 250, 252 which bear against one end of each of the cassettes 110, 111, respectively, and retain them in a predetermined position in the cassette holder 200. Dimensional variations in the cassettes 110, 111 and the cassette holder 200 are compensated by the retention bars 250, 252. The cassette retention means 224 further includes elongated release bars 254 slidably attached to the upper portions of each of the side members 226. The release bars 254 are attached to the side members 226 by fasteners 256 which pass through slotted holes 258 in the release bars 254. The release bars 254 are thus free to slide lengthwise along the sides of the cassette holder 200 by an amount determined by the length of the slotted holes 258. Referring to FIGS. 7 and 8, the release bars 254 are normally pulled to the right by tension springs 260 attached between the release bars 254 and the side members 226. The retention bar 250 passes through slotted holes in the side members 226 and is rigidly attached to the release bars 254. Therefore, the retention bar 250 is forced by the springs 260 against the end of the cassette 110. The retention bar 252 passes through slotted holes in the side members 226 and through slotted holes 262 in the release bars 254. The ends of the retention bar 252 are coupled through a pair of tension springs 264 to the side members 226. The springs 264 act only upon the retention bar 252 and force it against one end of the cassette 111. The abovedescribed arrangement provides independent spring loading of the retention bars 250, 252 by the springs 260, 264, respectively. The release bars 254 are pushed to the left for insertion or removal of the cassettes 110, 111. When this is done, the retention bar 250 is moved to the left directly, while the retention bar 252 remains stationary until the ends of the slotted holes 262 are reached. At this point the retention bar 252 is moved to the left by the release bars 254, and both of the cassettes 110, 111 are released from tension.

Referring again to FIGS. 2-4, the drive means 210 includes a motor 270 coupled through a slip clutch 271 and a mechanical stepper 272 to the ball reverser shaft 204. This arrangement, depending on the actuation of the mechanical stepper 272, can provide continuous or stepwise linear motion of the cassette holder 200. When the mechanical stepper 272 is operated in the stepping mode, it advances the cassette holder 200 by a distance equal to the spacing between wafers 112 in the cassettes 110, 111. Thus, any one of the wafers 112 can be positioned directly above the elevator blade 150. The use of the mechanical stepper 272 enables a relatively inexpensive fractional horsepower continuous motor 270 to be used. The use of the slip clutch 271 provides operator safety and protection of the mechanism in the event that the operation of the system is inadvertently blocked. The use of the ball reverser shaft 204 and the ball reverser nut 202 provide accurate conversion of rotary motion to linear motion and automatically reverse the direction of travel when the end of the ball reverser shaft 204 is reached by the ball reverser nut 202. Thus, reversible drive mechanisms are not required. A constant force spring 276 is mounted on the frame 130 and is attached by means of a flexible cable 278 to the cassette holder 200. The constant force spring 276 urges the cassette holder 200 in one direction at all times and compensates for any looseness in the ball reverser mechanism. This further insures accurate positioning of the wafers 112 over the elevator blade 150. A mechanical stop 280 is provided at one extreme of the travel of the cassette holder 200. When the cassette holder 200 reaches the extreme position, the release bars 254 are pushed to the left by the mechanical stop 280, and cassettes can be inserted or removed from the cassette holder 200. A strip resistor 282, having a length equal to the travel of the cassette holder 200, is positioned adjacent the ball reverser shaft 204. Contacts 284, attached so as to move with the cassette holder 200, provide electrical signals indicative of the position of the cassette holder 200 to the control electronics.

The means for prealigning the guide flat on each of the wafers 112 includes a roller 288 positioned below the cassettes 110, 111 so as to simultaneously contact the edges of all the wafers 112 in one of the cassettes 110, 111. The roller 288 is in the form of a cylinder which can be rotated by a motor 290 coupled thereto and is movable upward to an alignment position and downward to a retracted position by an air cylinder 292. The axis of the roller 288 is aligned with the long dimension of the cassettes 110, 111. The means 128 for prealigning can further include an element 294 with a flat surface 296 positioned below the cassettes 110, 111. The element 294 is movable upward to an alignment position in which the flat surface 296 contacts the wafers 112 and downward to a retracted position. The element 294 is moved upward and downward by an air cylinder 298.

Figure 4:
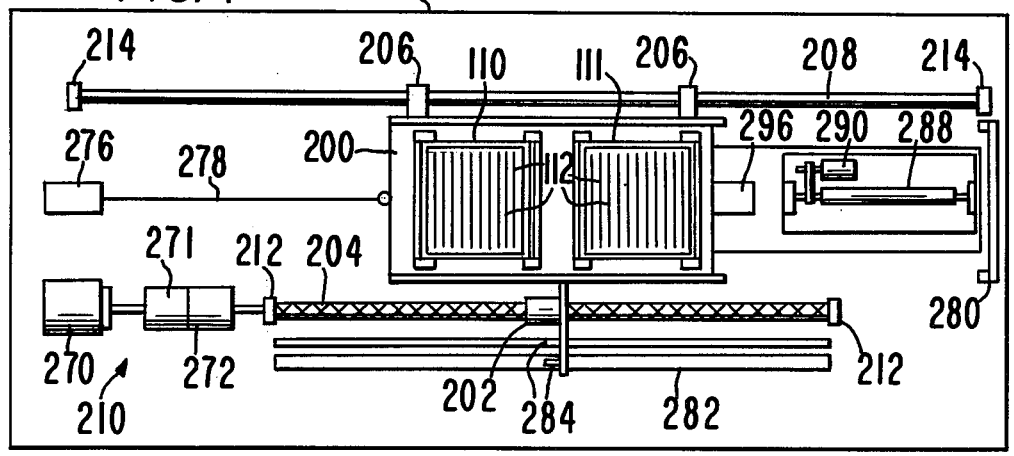
FIG. 4 is a simplified top view of an automated wafer transfer system.

The operation of the wafer transfer system described hereinabove will be explained with reference to FIGS. 2-4. It will be realized that the automated operation of the wafer transfer system described herein is controlled by a system controller (not shown) which actuates each mechanism at a prescribed time and for a prescribed duration. The controller can be a dedicated electronic controller or can be a computer operating through appropriate interface circuits.

Initially, an operator places the cassettes 110, 111 in the cassette holder 200 positioned at the right end of the cassette conveyor means 126 and initiates operation of the system. The holder 200 is moved by the ball reverser shaft 204 and the drive means 210 to a position above the roller 288. The roller 288 is moved upward to the alignment position and is rotated. The rotation of the roller 288 causes rotation of each of the wafers 112 until its guide flat is tangent to the roller 288 at the bottom of the cassette 110. Next, the roller 288 is retracted and the holder 200 is moved to position the cassette 110 above the element 294 which is then moved upward to the alignment position. The flat surface 296 slightly lifts each of the wafers 112 and then is lowered, thus causing the guide flat of each of the wafers to be accurately positioned at the bottom of the cassette 110. The operation of the element 294 removes minor variations in guide flat alignment remaining after operation of the roller 288.

The cassette 110 is next moved by the cassette conveyor means 126 to a position in which one of the wafers 112 is directly above the elevator blade 150. The blade 150 is raised by operation of the drive means 152 and the crank means 154, as described hereinabove, until it contacts the wafer 122 from below and engages edgewise the wafer 122 in the groove 156. The blade 150 moves upward through the cassette 110 and lifts the wafer 122 to a position adjacent the open chamber door, as shown in FIG. 2. The vacuum chuck 138 is extended outwardly from the chamber door 134 to a wafer-receiving position and holds wafer 122 through operation of vacuum suction upon the rear surface of the wafer 122. The elevator blade 150 is then lowered. FIG. 2 illustrates the operation at the point when the wafer 122 is transferred to the vacuum chuck 138.

Before the vacuum chuck 138 is retracted, or the chamber door 134 is moved to the sealed position, the wafer 122 is rotated to the desired orientation. Since the wafers have been prealigned in the cassette 110, any desired orientation can be obtained by rotating the vacuum chuck 138 through a preselected angular displacement. Orientation by rotation of the vacuum chuck 138 is described in detail in U.S. Ser. No. 381,286 filed concurrently herewith. After orientation of the wafer 122 by rotation of the vacuum chuck 138, the vacuum chuck 138 is retracted into the chamber door 134, and the wafer 122 is held against the platen 146 by the suction of the retracted vacuum chuck 138. Next, the air cylinder 136 is actuated so as to move the chamber door 134 to the sealed position. An air lock adjacent to the chamber door 134 is typically isolated from the main volume of the processing chamber by a vacuum gate valve 300 when the chamber door 134 is opened. The air lock minimizes the volume required to be vacuum pumped after the chamber door 134 is sealed. After the chamber door 134 is sealed, the air lock is evacuated, the vacuum gate valve 300 is opened and processing of the wafer proceeds. The wafer 122 is firmly clamped around its periphery against the platen 146 by a spring-loaded wafer clamping ring 302. In the present example, the processing of the wafer 122 involves scanning of a focused ion beam over the wafer surface in a uniform, repetitive pattern to provide a prescribed uniform dosage of impurities in the material of the semiconductor wafer 122.

When the processing of the wafer 122 has been completed, the vacuum gate valve 300 is closed and the chamber door 134 is opened by actuation of the air cylinder 136. The vacuum chuck 138, which has been rotated back to its initial position, is then extended and the elevator blade 150 is raised until the groove 156 engages the wafer 122. At this time, the vacuum chuck 138 releases the wafer 122 and is retracted into the chamber door 134. The wafer 122 is lowered by the elevator blade 150 into the same position in the cassette from which it originally came. The elevator blade 150 is moved to its lowered position below the cassette 110, and the cassette 110 is indexed by the cassette conveyor means 126 to the next wafer position. The elevator blade 150 raises the next wafer to the chamber door 134, and the process is repeated as described hereinabove. When each of the wafers 112 in the cassettes 110, 111 has been processed in accordance with this procedure, the cassette holder 200 is moved back to the right by the cassette conveyor means 126 for removal of the cassettes 110, 111 by the operator.

Thus, there is provided by the present invention new and improved apparatus for the automated vertical transfer of wafers between a cassette and a processing station. The apparatus is capable of accurately positioning standard plastic SEMI cassettes and of processing wafers of any standard size. The use of industry standard cassettes eliminates the step of transferring wafers into a specially designed cassette and eliminates the risk of damage associated with the transfer. The invention provides a vertical lift mechanism which rapidly raises and lowers wafers without increasing the risk of damage to the wafers. The system utilizes simple, inexpensive drive systems for positioning the cassette and for lifting the wafers. The system can provide any preselected angular orientation of the wafers. Furthermore, the drive mechanisms utilize slip clutches to insure operator safety and protection of the mechanisms.

While there has been shown and described what is at present considered the preferred embodiments of the invention, it will be obvious to those skilled in the art that various changes and modifications may be made therein without departing from the scope of the invention as defined by the appended claims.

What is claimed is:

1. In an automated wafer transfer system, apparatus for accurately positioning a cassette of the type having outwardly extending ribs along opposite sides thereof for access to individual wafers from below by a vertical wafer lift mechanism, said apparatus comprising:
   a cassette holder comprising
      a housing having a generally open top and bottom for access by said lift mechanism,
      cassette adaptor means including an adaptor plate mountable to the top of said housing and having an aperture corresponding in size to said cassette and cassette support means positioned for support of the cassette in said aperture by said outwardly extending ribs, and
      cassette retention means including a spring-loaded retention bar operative to bear against an end of the cassette and to retain it in a predetermined position in said cassette holder; and
   means for positioning said cassette holder relative to said vertical wafer lift mechanism.

2. The apparatus as defined in claim 1 wherein said retention bar is coupled to a pair of release bars slidably coupled to the sides of said housing and operative to slide lengthwise along said housing upon application of a force thereto and to release said retention bar for insertion or removal of cassettes.

3. The apparatus as defined in claim 2 wherein said adaptor means is easily removable from said housing whereby adaptor means for various cassette sizes can easily be mounted to said cassette holder.

4. The apparatus as defined in claim 2 wherein said cassette support means includes a plurality of support blocks each including a notch for receiving said outwardly extending ribs and for locating the cassette in said holder.

5. The apparatus as defined in claim 4 wherein said cassette holder is adapted for receiving at least two cassettes and wherein said cassette retention means includes an independently spring-loaded retention bar associated with each cassette.

6. The apparatus as defined in claim 5 wherein said release bars are operative to release each of said retention bars upon application of said force thereto.

7. The apparatus as defined in claim 2 wherein said means for positioning said cassette holder includes a ball reverser coupled to said cassette holder and drive means coupled to said ball reverser, said drive means and said ball reverser being operative to move said cassette holder along a linear path.

8. The apparatus as defined in claim 7 wherein said drive means includes a continuously operating motor coupled through a mechanical stepper to said ball reverser whereby said cassette holder can be moved continuously or in a stepping mode upon actuation of said mechanical stepper.

9. The apparatus as defined in claim 8 further including a constant force spring coupled between said cassette holder and a frame member in said apparatus whereby inaccuracies in positioning by said positioning means are reduced.

10. The apparatus as defined in claim 9 further including a mechanical stop associated with one end of said linear travel and operative to apply a force to said release bars when said cassette holder is positioned adjacent thereto.

11. The apparatus as defined in claim 10 wherein said motor is coupled to said mechanical stepper through a slip clutch whereby the operation of said apparatus stops if the motion thereof is blocked.

* * * * *